(12) United States Patent
Terashima et al.

(10) Patent No.: US 8,287,644 B2
(45) Date of Patent: Oct. 16, 2012

(54) METHOD FOR GROWING SILICON CARBIDE SINGLE CRYSTAL

(75) Inventors: Yukio Terashima, Mishima (JP); Yasuyuki Fujiwara, Shizuoka-ken (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 274 days.

(21) Appl. No.: 12/812,662

(22) PCT Filed: Jan. 14, 2009

(86) PCT No.: PCT/IB2009/000050
§ 371 (c)(1),
(2), (4) Date: Jul. 13, 2010

(87) PCT Pub. No.: WO2009/090536
PCT Pub. Date: Jul. 23, 2009

(65) Prior Publication Data
US 2010/0288188 A1    Nov. 18, 2010

(30) Foreign Application Priority Data

Jan. 15, 2008 (JP) .................................. 2008-005748

(51) Int. Cl.
*C30B 17/00* (2006.01)
*C30B 15/02* (2006.01)

(52) U.S. Cl. ............... 117/36; 117/11; 117/13; 117/19; 117/54; 117/60; 117/63; 117/64; 117/65; 117/67; 117/73; 117/76; 117/78; 117/79

(58) Field of Classification Search ............... 117/11, 117/13, 19, 36, 54, 60, 63–65, 67, 73, 76, 117/78–79, 951
See application file for complete search history.

(56) References Cited

U.S. PATENT DOCUMENTS
2005/0183657 A1    8/2005 Kusunoki et al.

FOREIGN PATENT DOCUMENTS
EP    1 895 031    3/2008
JP    2000-264790    9/2000
(Continued)

OTHER PUBLICATIONS

Mauk, et al. publication entitled "Experimental assessment of metal solvents for low-temperature liquid-phase epitaxy of silicon carbide," Journal of Crystal Growth, vol. 225, pp. 322-329 (2001).*

(Continued)

*Primary Examiner* — Michael Kornakov
*Assistant Examiner* — Kenneth A Bratland, Jr.
(74) *Attorney, Agent, or Firm* — Finnegan, Henderson, Farabow, Garrett & Dunner, LLP

(57) ABSTRACT

In a method for growing a silicon carbide single crystal on a silicon carbide single crystal substrate by contacting the substrate with a solution containing C by dissolving C into the melt that contains Si, Cr and X, which consists of at least one element of Sn, In and Ga, such that the proportion of Cr in the whole composition of the melt is in a range of 30 to 70 at. %, and the proportion of X is in a range of 1 to 25 at. %, and the silicon carbide crystal is grown from the solution.

19 Claims, 3 Drawing Sheets

| FOREIGN PATENT DOCUMENTS | | |
|---|---|---|
| JP | 2002-356397 | 12/2002 |
| JP | 2004-2173 | 1/2004 |
| JP | 2005-82435 | 3/2005 |
| JP | 2006-143555 | 6/2006 |
| JP | 2006-321681 | 11/2006 |
| JP | 2007-76986 | 3/2007 |
| JP | 2007-261844 | 10/2007 |
| WO | WO 2007/116315 A | 10/2007 |
| WO | WO 2007116315 A1 * | 10/2007 |

OTHER PUBLICATIONS

German Office Action for DE 11 2009 000 360.5 dated Sep. 22, 2011.
International Search Report in International Application No. PCT/IB2009/000050, mailed Apr. 28, 2009.
Written Opinion of the International Searching Authority in International Application No. PCT/IB2009/000050, received Apr. 27, 2009.
Response to Written Opinion of the International Searching Authority in International Application No. PCT/IB2009/000050 (Oct. 29, 2009).

* cited by examiner

METHOD FOR GROWING SILICON CARBIDE SINGLE CRYSTAL

CROSS-REFERENCE TO RELATED APPLICATIONS

This application is a national phase application of International Application No. PCT/IB2009/000050, filed Jan. 14, 2009, and claims the priority of Japanese Application No. 2008-005748, filed Jan. 15, 2008, the contents of both of which are incorporated herein by reference.

BACKGROUND OF THE INVENTION

1. Field of Invention

The invention relates to a novel method for growing silicon carbide single crystals by liquid phase deposition. More particularly, the invention is concerned with a method for growing silicon carbide single crystals at an increased growth rate by liquid phase deposition using a novel solution.

2. Description of the Related Art

Silicon carbide (SiC) single crystals have excellent physical properties, such as considerably high thermal and chemical stability, high mechanical strength, high radiation hardness, higher breakdown voltage than that of Si, and high thermal conductivity. By adding a suitably selected impurity to the silicon carbide single crystal, it readily provides a p-conductivity-type or n-conductivity-type semiconductor, which has a relatively large forbidden bandwidth (about 3.0 eV in the case of a 6H—SiC single crystal, and about 3.3 eV in the case of a 4H—SiC single crystal). Accordingly, semiconductor devices using the silicon carbide single crystals can be used under high-temperature and high-frequency operating conditions, and are highly resistant to high voltage and harsh environments, though these characteristics cannot be satisfactorily achieved by conventional semiconductor materials, such as silicon (Si) and gallium arsenide (GaAs). Thus, silicon carbide has been increasingly expected as a next-generation semiconductor material.

Typical methods for growing silicon carbide single crystals include, for example, vapor phase deposition or vapor phase epitaxy (VPE), the Acheson method, and liquid phase deposition or solution method. Typical examples of the vapor phase deposition or VPE method include a sublimation process and chemical vapor deposition (CVD). In the sublimation process, various types of defects are likely to be generated in the resultant crystal, and the crystal tends to be polycrystalline. The CVD method uses only gaseous sources as feed materials; therefore, the crystal formed by this method takes the form of a thin film. It is thus difficult to produce a bulk single crystal by the CVD method. The Acheson method uses silica and coke as source materials, which are heated in an electric furnace; therefore, it is difficult or impossible for the resultant crystal to achieve high purity due to the presence of impurities, or the like, in the materials. In an example of method using liquid phase deposition, a silicon-containing alloy is dissolved into a melt in a graphite crucible, and carbon is dissolved from the graphite crucible into the melt, so that a silicon carbide crystal layer derived from the solution is deposited and grown on a seed crystal substrate placed in a low-temperature portion of the solution. Although silicon carbide single crystals are grown at a low rate by liquid phase deposition, in other words, liquid-phase production of silicon carbide single crystals suffers from a low growth rate, it is an advantageous method for producing bulk single crystals. Thus, various studies have been made in recent years (see Japanese Patent Application Publication No. 2000-264790 (JP-A-2000-264790), Japanese Patent Application Publication No. 2004-2173 (JP-A-2004-2173), Japanese Patent Application Publication No. 2006-143555 (JP-A-2006-143555), and Japanese Patent Application Publication No. 2007-76986 (JP-A-2007-76986)), in an attempt to increase the growth rate in the growth of silicon carbide single crystals by liquid phase deposition, which is free from the above-described problems as encountered in vapor phase deposition and the Acheson method.

In a method for producing a silicon carbide single crystal as described in JP-A-2000-264790 as identified above, a source material containing at least one element selected from transition metals, Si and C (carbon) is dissolved into a melt (i.e., C (carbon) is dissolved into the melt which is a solvent containing the at least one element selected from transition metals and Si), with which a silicon carbide seed crystal in the form of a single crystal is brought into contact, and the solution is cooled into a condition where the temperature of the solution is lower than the liquidus line of the solution, so that a silicon carbide single crystal is deposited and grown on the seed crystal. While the transition metals listed by way of example in this publication are Fe, Co, Ni (which belong to the VIII group), Ti, Zr, Hf (which belong to the IVb group), V, Nb, Ta (which belong to the Vb group), and Cr, Mo, W (which belong to the VIb group), only the compositions of the materials containing Mo, Cr, or Co as a transition metal are specifically disclosed. In this publication, there is no disclosure of a method or means for measuring and evaluating the quality and stability of the deposited single crystal.

JP-A-2004-2173 as identified above discloses a melt of an alloy containing Si, and M (M: Mn or Ti) in which, where the atomic ratio of Si and M is represented by $Si_{1-x}M_x$, $0.1 \leq X \leq 0.7$ when M is Mn, and $0.1 \leq X \leq 0.25$ when M is Ti. The melt does not contain undissolved C. C is dissolved into the melt from a graphite crucible. In a method for producing silicon carbide single crystal as described in JP-A-2004-2173, a substrate of a silicon carbide seed crystal is dipped into the solution, and the alloy melt around the seed crystal substrate is supercooled so that the solution is supersaturated with silicon carbide, whereby a silicon carbide single crystal is grown on the seed crystal substrate. With regard to the method for producing a silicon carbide single crystal as described in JP-A-2000-264790, it is stated in JP-A-2004-2173 that the silicon carbide produced by this method is likely to be polycrystalline because of the inclusion of carbon in the source material, and the growth rate reaches only 100 μm/h or lower when the temperature of the solution is not higher than 2000° C.

JP-A-2006-143555 as identified above discloses a melt (a solution containing C) of an alloy containing Si, C and M (M: Fe or Co) in which, where [M] is the molar concentration of M and [Si] is the molar concentration of Si, a value of [M]/([M]+[Si]) is equal to or larger than 0.2 and equal to or smaller than 0.7 when M is Fe, and is equal to or larger than 0.05 and equal to or smaller than 0.25 when M is Co. In a method for producing a silicon carbide single crystal as described in JP-A-2006-143555, a seed crystal substrate made of silicon carbide is dipped into the melt of the alloy (the solution containing C), and the alloy melt around the seed crystal substrate is supersaturated with silicon carbide, whereby a silicon carbide single crystal is grown on the seed crystal substrate. In specific examples using the alloys as described above, silicon carbide single crystals are grown at a growth rate of 24.6 μm/h to 75.2 μm/h.

JP-A-2007-76986 as identified above discloses a solution that contains a melt that includes Si, Ti, M (M: Co and/or Mn) as a solvent and C as a solute, and satisfies the relationships of $0.17 \leq y/x \leq 0.33$ and $0.90 \leq (y+Z)/x \leq 1.80$ where the atomic ratio of Si, Ti and M is represented by $Si_xTi_yM_z$, and a solution that contains Si, Ti, M (M: Al) and C, and satisfies the relationships of $0.17 \leq y/x \leq 0.33$ and $0.33 \leq (y+Z)/x \leq 0.60$ where the atomic ratio of Si, Ti and M is represented by $Si_xTi_yM_z$. In a method for producing a silicon carbide single crystal as described in JP-A-2007-76986, a seed crystal substrate for use in the growth of silicon carbide is brought into contact with the former solution or the latter solution as indicated above, and the solution around the seed crystal substrate is supercooled so as to be supersaturated with silicon carbide dissolved in the solution, whereby a silicon carbide single crystal is grown on the seed crystal substrate. The growth thickness of the silicon carbide single crystal per 100 min. in specific examples using the above-indicated metals ranges from 17.9 μm to 145.0 μm (that corresponds to the range of 10.7 μm/h to 86.8 μm/h when converted into the growth rate).

As is understood from the above description, it is difficult to grow silicon carbide single crystals at a sufficiently high growth rate, by the methods for growing silicon carbide bulk single crystals by liquid phase deposition as described in the above-identified publications.

SUMMARY OF THE INVENTION

It is an object of the invention to provide a method for growing a silicon carbide single crystal at an increased growth rate, as compared with known methods for crystal growth by liquid phase deposition.

A first aspect of the invention relates to a method for growing a silicon carbide single crystal on a silicon carbide single crystal substrate by contacting the substrate with a solution containing C prepared by heating and melting Si in a graphite crucible, and dissolving C into a melt containing Si from the graphite crucible. In the method, the solution containing C is prepared by dissolving C into the melt that contains Cr and X, which consists of at least one element of Sn, In and Ga, such that a proportion of Cr in a whole composition of the melt is in a range of 30 to 70 at. %, and a proportion of X in the whole composition of the melt is in a range of 1 to 25 at. %, and the silicon carbide single crystal is grown from the solution.

A second aspect of the invention relates to a method for growing a silicon carbide single crystal. The method includes the step of preparing a solution containing C by dissolving C into a melt containing Si, Cr and X which is at least one element of Sn, In and Ga in a crucible while heating the crucible; and the step of bringing a silicon carbide single crystal substrate into contact with the solution so as to grow the silicon carbide single crystal on the silicon carbide single crystal substrate. A proportion of Cr in the whole composition of the melt is in a range of 30 to 70 at. %, and a proportion of X in the whole composition of the melt is in a range of 1 to 25 at. %.

According to the invention, the silicon carbide single crystal can be grown at a higher growth rate, as compared with known liquid-phase crystal growth methods as described in publications or documents of the related art.

BRIEF DESCRIPTION OF THE DRAWINGS

The foregoing and further objects, features and advantages of the invention will become apparent from the following description of exemplary embodiments with reference to the accompanying drawings, wherein like numerals are used to represent like elements and wherein.

DETAILED DESCRIPTION OF EMBODIMENTS

An embodiment of the invention will be described. More specifically, a method for growing a silicon carbide single crystal will be described in which at least one element selected from Sn, In and Ga is added into a melt such that the proportion of the element(s) in the whole composition of the melt is controlled to be within the range of 1 to 20 at. %, and the silicon carbide single crystal is grown using the thus obtained melt.

In the method for growing a silicon carbide single crystal by liquid phase deposition, a Si—Cr—X melt is prepared by adding Cr and X (X is at least one of Sn, In and Ga), along with Si, such that the proportion of Cr in the whole composition of the melt is controlled to be within the range of 30 to 70 at. %, and the proportion of X is controlled to be within the range of 1 to 25 at. %, more preferably, within the range of 1 to 20 at. %, and the silicon carbide crystal is deposited and grown from the Si—Cr—X—C prepared by dissolving C into the melt. The above-indicated X is selected from Ga and In that are elements of the IIIa group, and Sn that is an element of the IVa group. Among these elements, Sn is preferably used as X since it is easily available.

With regard to the proportion of Cr in the Si—Cr—X melt, the growth rate of the silicon carbide single crystal is significantly reduced if the proportion of Cr is less than 30 at. %, and polycrystals are likely to be formed around the silicon carbide single crystal if the proportion of Cr is larger than 70 at. %, which makes it difficult to stably grow a crystal that consists solely of a single crystal. Thus, the proportion of Cr in the Si—Cr—X melt is appropriately controlled to be within the range of 30 at. % to 70 at. %. Also, if the proportion of X in the Si—Cr—X melt is less than 1 at. %, the effect of improving the growth rate of the silicon carbide single crystal is reduced. If the proportion of X in the Si—Cr—X melt is larger than 25 at. %, no effect of improving the growth rate of the silicon carbide single crystal is found, or, even if any effect is found, a part or the whole of the resultant crystal is made polycrystalline, thus making it difficult to achieve stable growth of a single crystal.

Figure 1:
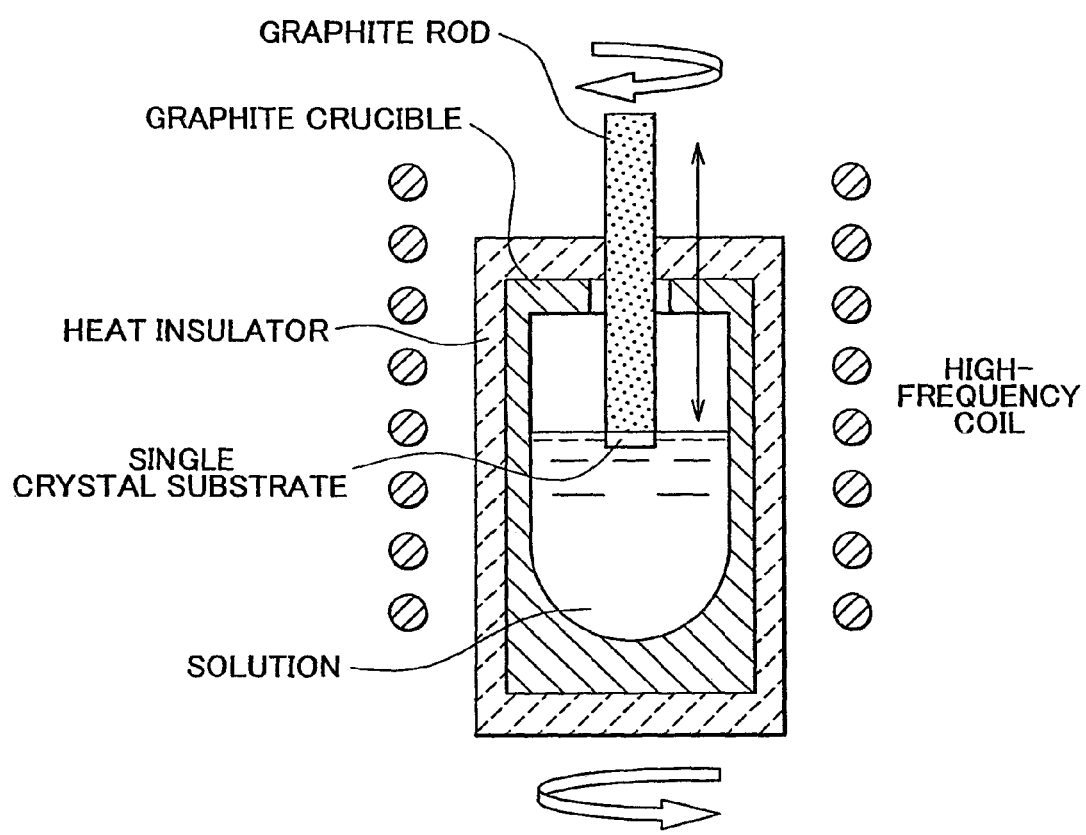
FIG. 1 shows an example of production apparatus used for implementing a method of this invention.

A production apparatus used for implementing the method of this embodiment of the invention will be described with reference to FIG. 1. In FIG. 1, a single crystal substrate made of silicon carbide is bonded and fixed to a tip of a graphite rod (which may also be called "graphite shaft") as one example of silicon carbide seed crystal support member. The graphite rod is dipped into a solution that is prepared by dissolving C into the melt heated by high-frequency coils serving as a heating device, so that a silicon carbide single crystal is grown on the single crystal substrate.

Although the reason why the growth rate of the silicon carbide single crystal is significantly increased when the Si—Cr—X—C solution having the composition as described above is used is unclear, Cr contributes to an improvement in the capability of dissolving C (carbon) from graphite (the crucible in the apparatus of FIG. 1) that contacts with the melt, with the result that C dissolved from the crucible constitutes the source material of the silicon carbide crystal. It is thus conceivable that Cr and X cooperate with each other to contribute to a further improvement or increase in the growth rate of the silicon carbide single crystal.

A procedure for preparing the Si—Cr—X—C solution having the above-described composition so as to produce a silicon carbide single crystal according to the method of this embodiment is not particularly limited. For example, Si, Cr and X that constitute a source material are initially put into a graphite crucible serving as a reactor, and a melt is formed by dissolving the source material to form an alloy and heating the alloy to a temperature higher than the solidus temperature of the alloy. In this connection, it is preferable to simultaneously add Cr and X to Si to produce the source material. At least a part of C in the Si—Cr—X—C solution is dissolved from the graphite crucible into the melt. While it is particularly preferable that the whole of C is supplied through dissolution from the graphite crucible, a part of C may be supplied in the form of a carbide or carbon contained in the source material of the melt, or a part of C may be supplied by blowing a carbon-containing gas, such as methane gas, into the melt.

As heating of the melt is continued, the source material consisting of Si, Cr and X is sufficiently melten, and C is sufficiently dissolved into the melt from the graphite crucible, so that the concentration of carbon in the solution thus produced reaches a level close to the saturation concentration of silicon carbide in the melt as a solvent, and becomes constant. Then, a seed crystal substrate used for the growth of silicon carbide is brought into contact with the solution, and the solution around the seed crystal substrate is supercooled to a temperature of 2100° C. or lower, more particularly, a temperature of about 1600 to 1800° C., by a temperature gradient method by which the solution is provided with a temperature gradient of about 5 to 50° C./cm, or a cooling method of cooling the solution by controlling the operation of the heating device. As a result, the solution is supersaturated with silicon carbide dissolved therein, so that a silicon carbide single crystal is grown on the seed crystal substrate. As the above-mentioned seed crystal substrate, a substrate having the same crystal form as that of silicon carbide to be grown is preferably used. For example, a single crystal of silicon carbide produced by a sublimation process may be used.

In the method of this embodiment, known conditions or parameters, such as the shape of the graphite crucible, a heating method, a heating period of time, an atmosphere, the rate of increase of the temperature and the rate of cooling, of conventional production methods using liquid phase deposition may be employed. For example, high-frequency induction heating may be used as the heating method. The heating period (i.e., an approximate period of time from introduction of the source material to the time when the solution reaches the silicon carbide saturation concentration) may be about several hours to 10 hours (e.g., about 3 to 7 hours), though it depends on the size of the crucible. The atmosphere may be selected from rare gases, such as inert gases like He, Ne and Ar, and gases obtained by replacing part of the inert gas with $N_2$ or methane gas.

According to the method of this embodiment, silicon carbide single crystals (n-type silicon carbide single crystals in the case of Sn, p-type silicon carbide single crystals in the case of Ga and In) that are substantially free from polycrystals can be produced at a higher growth rate, as compared with known methods for growing silicon carbide single crystals by liquid phase deposition using a known three-component system (for example, Si—Cr—C solution) or four-component system (for example, Si—Ti—Al—C solution, Si—Ti—Mn—C solution, or Si—Ti—Co—C solution). The method of this invention may be applied not only to a method for growing bulk single crystals, but also to a technique for forming a liquid-phase epitaxial growth layer on a surface of a silicon carbide substrate.

In the following, some specific examples of the invention will be shown. In each of the following examples, an experiment on the growth of a silicon carbide single crystal was conducted using an apparatus including the graphite crucible shown in FIG. 2 as a reactor. In each of the examples, Si was put into the graphite crucible, and Cr and X were then added at the same time into the graphite crucible. After the source material of Si, Cr and X was kept heated for about 2 to 3 hours and the resultant melt (solution) was maintained at a set temperature (1800 to 2100° C.), a silicon carbide single crystal substrate was dipped into the solution into which C was dissolved from the graphite crucible so that it reached the silicon carbide saturation concentration. Then, high-frequency coils serving as a heating device were controlled so as to provide the single crystal substrate and the front surface of the crystal under growth with a temperature gradient of 0.8 to 3.0° C./mm, so that a silicon carbide single crystal was grown on the single crystal substrate. After a lapse of a predetermined time for the growth, the grown crystal was completely pulled out of the solution, and the crucible was gradually cooled down to the room temperature. In this manner, a grown silicon carbide single crystal was obtained. It was determined, by means of X rays (XRD), whether the silicon carbide crystal obtained in each example was a single crystal or a polycrystal.

EXAMPLES 1-7

Figure 2:
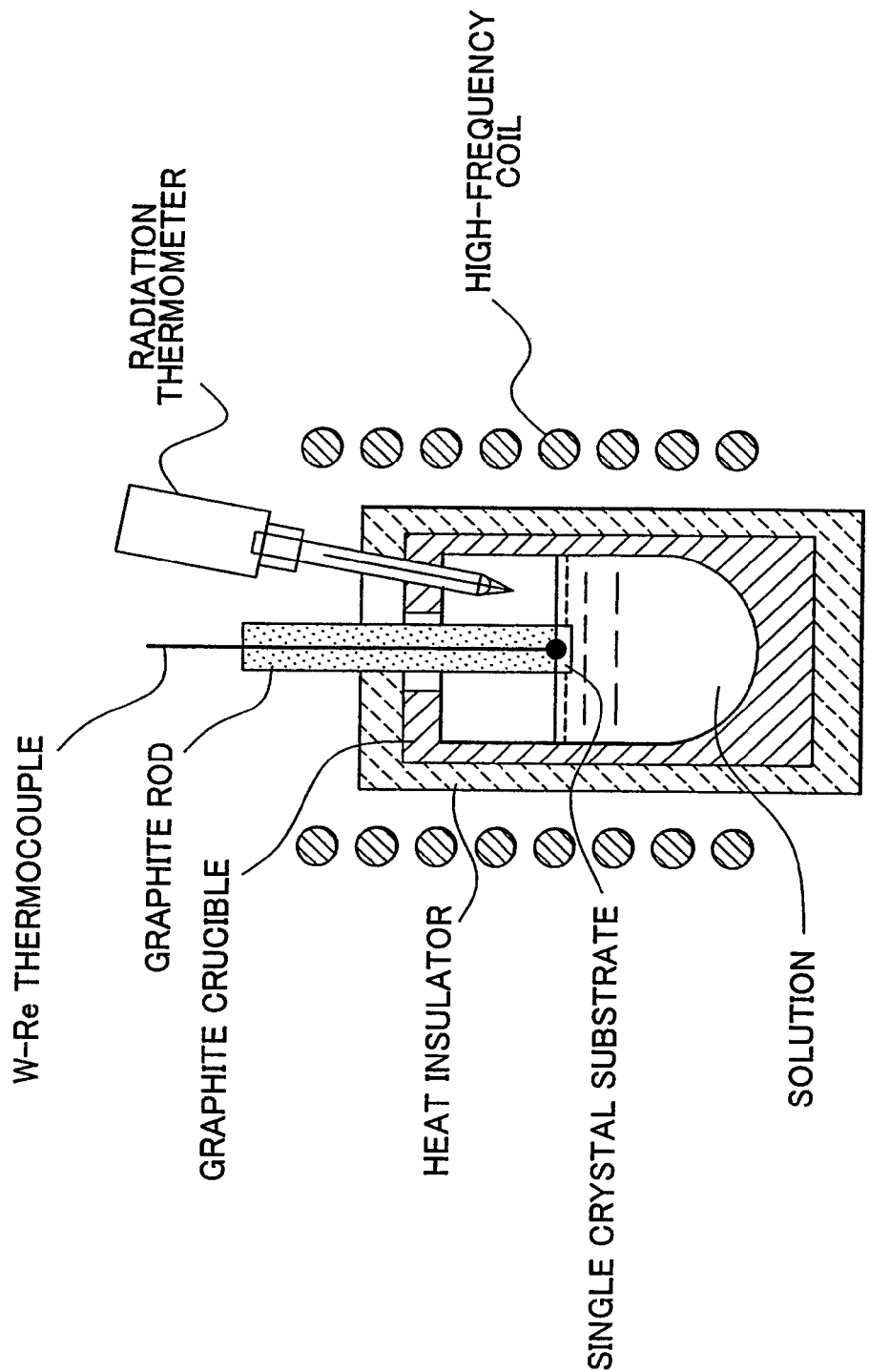
FIG. 2 shows an apparatus with which an experiment on the growth of a silicon carbide single crystal is conducted in each example.

A source material composed of Si, Cr and Sn in proportions as indicated in TABLE 1 below was heated and molten. While the source material is molten, C was dissolved into the melt from a graphite crucible. The solution was kept at a certain temperature, and a single crystal substrate was dipped into the solution, to permit growth of a crystal on the substrate. The silicon carbide crystal obtained in each of these examples was confirmed to be an n-type single crystal. The temperature of the solution, etc. was measured with a radiation thermometer and a thermocouple as shown in FIG. 2. The radiation thermometer was installed at an observation window that is located above a surface of the solution to permit direct observation of the solution surface, and was able to measure temperatures before and after contacting of the single crystal substrate with the solution. Also, the thermocouple was installed in the interior (e.g., at a position 2 mm apart from the single crystal substrate) of the graphite rod to which the single crystal substrate was bonded, and measured the temperature from the time immediately after contacting of the single crystal substrate with the solution. The compositions of the source materials used in Examples 1 to 7 and the growth rates measured with respect to these examples are shown in TABLE 1 below.

Comparative Example 1

A silicon carbide crystal of Comparative Example 1 was grown in the same manner as in Example 1, except that a source material composed Si, Cr and Sn in proportions as indicated in TABLE 1 below was put into the graphite crucible. The composition of the source material and the growth rate measured during crystal growth are also shown in TABLE 1 below.

TABLLE 1

| | Examples of Invention | | | | | | | Com. Ex. |
|---|---|---|---|---|---|---|---|---|
| No. | 1 | 2 | 3 | 4 | 5 | 6 | 7 | 1 |
| Amount of Sn (at. %) | 1 | 3 | 5 | 7 | 10 | 20 | 25 | 30 |
| Amount of Si (at. %) | 50 | 49 | 48 | 48 | 45 | 40 | 38 | 32 |
| Amount of Cr (at. %) | 49 | 48 | 47 | 45 | 45 | 40 | 37 | 28 |
| Growth Rate (μm/h) | 358 | 380 | 445 | 480 | 478 | 520 | 401 | 175 |

As is understood from TABLE 1, the growth rate of the silicon carbide single crystal was in the range of 358 to 520 μm/h (time) when the proportion of Sn in the whole composition of the source material (a solvent that is Si—Cr—Sn melt) was 1 to 25 at. %, and the growth rate was in the range of 380 to 520 μm/h when the proportion of Sn was 3 to 25 at. %. When the proportion of Sn was 5 to 20 at. %, in particular, the growth rate of the silicon carbide single crystal was in the range of 445 to 520 μm/h. Thus, a remarkable improvement in the growth rate was observed in the Si—Cr—Sn melt system. When the proportion of Sn was 30 at. %, however, the growth rate was significantly reduced.

EXAMPLES 8-12

Silicon carbide single crystals of Examples 8 to 12 were grown by substantially the same manner as in Example 1, except that a source material composed of Si, Cr and In in proportions as indicated in TABLE 2 below was heated and molten. While the source material is molten, C is dissolved into the melt from a graphite crucible. The solution was kept at a certain temperature (about 1980° C.), and a seed crystal was dipped into the solution to permit growth of a crystal on the seed crystal. The silicon carbide crystal obtained in each of these examples was confirmed to be a p-type single crystal. The compositions of the source materials used in Examples 8 to 12 and the growth rates measured with respect to these examples are shown in TABLE 2 below.

Comparative Example 2

A silicon carbide crystal of Comparative Example 2 was grown in the same manner as in Example 8, except that a source material composed Si, Cr and In in proportions as indicated in TABLE 2 below was put into the graphite crucible. The composition of the source material and the growth rate measured during crystal growth are also shown in TABLE 2 below.

TABLE 2

| | Examples of Invention | | | | | Com.Ex. |
|---|---|---|---|---|---|---|
| No. | 8 | 9 | 10 | 11 | 12 | 2 |
| Amount of In (at. %) | 1 | 3 | 5 | 20 | 25 | 30 |
| Amount of Si (at. %) | 50 | 49 | 48 | 40 | 38 | 32 |
| Amount of Cr (at. %) | 49 | 48 | 47 | 40 | 37 | 28 |
| Growth Rate (μm/h) | 475 | 520 | 580 | 621 | 475 | 175 |

As is understood from TABLE 2, the growth rate of the silicon carbide single crystal was in the range of 475 to 621 μm/h when the proportion of In in the whole composition of the source material (a solvent that is Si—Cr—In melt) was 1 to 25 at. %. Thus, a remarkable improvement in the growth rate was observed in the Si—Cr—In melt system. When the proportion of In was 30 at. %, however, the growth rate was significantly reduced.

EXAMPLES 13-17

Silicon carbide single crystals of Examples 13 to 17 were grown by substantially the same manner as in Example 1, except that a source material composed of Si, Cr and Ga in proportions as indicated in TABLE 3 below was put into a graphite crucible, and was heated and molten. While the source material is molten, C is dissolved into the melt from a graphite crucible. The solution was kept at a certain temperature (about 1980° C.), and a seed crystal was dipped into the solution to permit growth of a crystal on the seed crystal. The silicon carbide crystal obtained in each of these examples was confirmed to be a p-type single crystal. The compositions of the source materials used in Examples 13 to 17 and the growth rates measured with respect to these examples are shown in TABLE 3 below.

TABLE 3

| | Examples of Invention | | | | |
|---|---|---|---|---|---|
| | 13 | 14 | 15 | 16 | 17 |
| Amount of Ga (at. %) | 1 | 3 | 5 | 10 | 20 |
| Amount of Si (at. %) | 50 | 49 | 48 | 45 | 40 |
| Amount of Cr (at. %) | 49 | 48 | 47 | 45 | 40 |
| Growth Rate (μm/h) | 322 | 320 | 380 | 412 | 420 |

As is understood from TABLE 3, the growth rate of the SiC single crystal was in the range of 322 to 420 μm/h when the proportion of Ga in the whole composition of the source material (a solvent that is Si—Cr—Ga melt) was 1 to 20 at. %, and the growth rate increased as the proportion of Ga increased. When the proportion of Ga was 5 to 20 at. %, in particular, the growth rate of the silicon carbide single crystal was in the range of 380 to 420 μm/h. Thus, a remarkable improvement in the growth rate was observed in the Si—Cr—Ga melt system.

Comparative Example 3

Some specimens of three-component Si—Cr melts, to which none of Sn, In and Ga was added, were prepared by putting a source material composed of Si and Cr with the proportion of Cr varied within the range of 3 to 95 at. % into a graphite crucible, and heating and melting the source material. While the source material is molten, C is dissolved into the melt from a graphite crucible. The solution was kept at a certain temperature (about 1980° C.), and a single crystal substrate was dipped into the solution so that a crystal was grown on the substrate in the same manner as in Example 1. The proportion of Cr in the composition of the source material and the growth rate measured with respect to each specimen of Si—Cr melt are shown in TABLE 4 below.

TABLE 4

Figure 3:
FIG. 3 shows a cross section of a silicon carbide single crystal obtained from a Si—Cr melt of Comparative Example 3 under a condition that the proportion of Cr in the sum of Si and Cr is 50 at. %.
Figure 4:
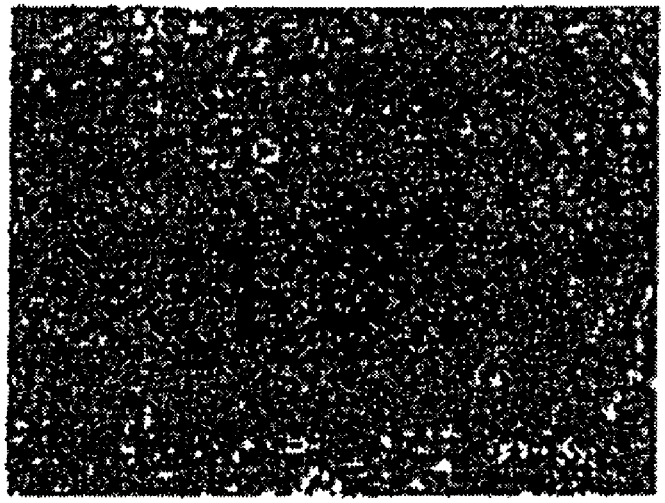
FIG. 4 shows a cross section of a silicon carbide single crystal obtained from a Si—Cr melt of Comparative Example 3 under a condition that the proportion of Cr in the sum of Si and Cr is 90 at. %.

| Proportion of Cr (at. %) (in the sum of Si and Cr) | Growth Rate (μm/h) | Notes |
|---|---|---|
| 3 | 0 | |
| 5 | 5 | |
| 10 | 5 | |
| 15 | 3 | |
| 20 | 27 | |
| 25 | 45 | |
| 30 | 160 | |
| 40 | 250 | |
| 50 | 300 | A cross section of the single crystal is shown in FIG. 3 |
| 60 | 350 | |
| 70 | 310 | |
| 80 | 270 | |
| 90 | 180 | A cross section of the single crystal is shown in FIG. 4 |

As indicated above, the growth rate of the single crystal formed from the Si—Cr melt was low when the proportion of Cr in the sum of Si and Cr was smaller than 30 at. %. When the proportion of Cr in the sum of Si and Cr was larger than 70 at. %, a part or the whole of the resultant silicon carbide crystal was made polycrystalline.

Comparative Example 4

Some specimens of melts were prepared by putting a source material composed of Si, Ti and Al with the proportion of Al varied within the range of 0 to 10 at. % into a graphite crucible, and heating and melting the source material. The melt was kept at a certain temperature (about 1820° C.), and a single crystal substrate was dipped into the melt, so that a crystal was grown on the single crystal substrate in the same manner as in Example 1. Even if the proportion of Al in the whole composition of the source material was varied, the growth rate was equal to or lower than 140 μm/h at the highest.

While the graphite crucible was used for the growth of silicon carbide single crystals in the above-described embodiment and examples, a crucible may be another crucible such as a ceramic crucible etc. In this case, carbon is supplied to such a crucible.

The invention claimed is:

1. A method for growing a silicon carbide single crystal on a silicon carbide single crystal substrate by contacting the substrate with a solution containing C prepared by heating and melting Si in a graphite crucible, and dissolving C into a melt containing Si from the graphite crucible, comprising:
preparing the solution containing C by dissolving C into the melt that contains Cr and X, which consists of at least one element of Sn, In and Ga, such that a proportion of Cr in a whole composition of the melt is in a range of 30 to 70 at. %, and a proportion of X in the whole composition of the melt is in a range of 1 to 25 at. %; and
growing the silicon carbide single crystal from the solution.

2. The method according to claim 1, wherein X is added to the melt so that the proportion of X is in a range of 1-20 at. %.

3. The method according to claim 1, wherein X is Sn.

4. The method according to claim 3, wherein Sn is added to the melt so that the proportion of Sn is in a range of 3 to 25 at. %.

5. The method according to claim 4, wherein Sn is added to the melt so that the proportion of Sn is in a range of 5 to 20 at. %.

6. The method according to claim 1, wherein X is In.

7. The method according to claim 1, wherein X is Ga.

8. The method according to claim 7, wherein Ga is added to the melt so that the proportion of Ga is in a range of 5 to 20 at. %.

9. The method according to claim 1, wherein Si, Cr and X are heated to a temperature higher than a solidus temperature in the graphite crucible, to provide the solution.

10. The method according to claim 1, wherein Cr and X are simultaneously put into the graphite crucible.

11. The method according to claim 1, wherein C is supplied exclusively from the graphite crucible.

12. The method according to claim 1, wherein heating of the graphite crucible is continued so as to melt a source material comprising Si, Cr and X, and dissolve C from the graphite crucible, and the silicon carbide single crystal substrate is brought into contact with the solution after a carbon concentration in the solution reaches a saturation concentration of silicon carbide in the solution.

13. The method according to claim 1, wherein:
the solution is cooled by a temperature gradient method that provides the solution with a temperature gradient of 5 to 50° C./cm; and
the solution around the silicon carbide single crystal substrate is supercooled to a temperature of 2100° C. to 1600° C., so that the solution is supersaturated with silicon carbide dissolved in the solution, whereby the silicon carbide single crystal is grown on the single crystal substrate.

14. The method according to claim 1, wherein the solution is cooled by controlling a heating device so that the solution around the silicon carbide single crystal substrate is supercooled to a temperature of 2100° C. to 1600° C., and the solution is supersaturated with silicon carbon dissolved in the solution, whereby the silicon carbide single crystal is grown on the single crystal substrate.

15. The method according to claim 13, wherein the solution around the silicon carbide single crystal substrate is supercooled to a temperature of 2100° C. to 1800° C. so that the solution is supersaturated with silicon carbide dissolved in the solution.

16. The method according to claim 15, wherein the solution around the silicon carbide single crystal substrate is supercooled to a temperature of about 1980° C. so that the solution is supersaturated with silicon carbide dissolved in the solution.

17. The method according to claim 15, wherein the solution around the silicon carbide single crystal substrate is supercooled, and is kept at a constant temperature, so that the solution is supersaturated with silicon carbide dissolved in the solution.

18. A method for growing a silicon carbide single crystal, comprising:
preparing a solution containing C by dissolving C into a melt containing Si, Cr and X which is at least one element of Sn, In and Ga in a crucible while heating the crucible; and
bringing a silicon carbide single crystal substrate into contact with the solution so as to grow the silicon carbide single crystal on the silicon carbide single crystal substrate,
wherein a proportion of Cr in the whole composition of the melt is in a range of 30 to 70 at. %, and a proportion of X in the whole composition of the melt is in a range of 1 to 25 at. %.

19. The method according to claim 18, wherein the crucible is a graphite crucible.

* * * * *